(12) United States Patent
Okuzono et al.

(10) Patent No.: US 12,147,104 B2
(45) Date of Patent: Nov. 19, 2024

(54) DISPLAY DEVICE

(71) Applicant: SHANGHAI TIANMA MICRO-ELECTRONICS CO., LTD., Shanghai (CN)

(72) Inventors: Noboru Okuzono, Kanagawa (JP); Hitoshi Hiratsuka, Kanagawa (JP); Katsuhiro Ito, Kanagawa (JP)

(73) Assignee: SHANGHAI TIANMA MICRO-ELECTRONICS CO., LTD., Shanghai (CN)

( * ) Notice: Subject to any disclaimer, the term of this patent is extended or adjusted under 35 U.S.C. 154(b) by 0 days.

(21) Appl. No.: 18/637,646

(22) Filed: Apr. 17, 2024

(65) Prior Publication Data

US 2024/0353703 A1     Oct. 24, 2024

(30) Foreign Application Priority Data

Apr. 20, 2023   (JP) ................. 2023-069467

(51) Int. Cl.
*G02F 1/1333*  (2006.01)
*G02F 1/1345*  (2006.01)
*H05K 9/00*    (2006.01)

(52) U.S. Cl.
CPC .... *G02F 1/133334* (2021.01); *G02F 1/13338* (2013.01); *G02F 1/13452* (2013.01); *H05K 9/0054* (2013.01)

(58) Field of Classification Search
CPC ........... G02F 1/133334; G02F 1/13338; G02F 1/13452; H05K 9/0054
USPC ............................... 349/40, 54–55, 149–152
See application file for complete search history.

(56) References Cited

U.S. PATENT DOCUMENTS

2014/0176840 A1   6/2014  Hashido
2019/0163003 A1*  5/2019  Kim ..................... G06F 1/1626

* cited by examiner

*Primary Examiner* — Charles S Chang
(74) *Attorney, Agent, or Firm* — NIXON & VANDERHYE

(57) ABSTRACT

A display device includes a driver circuit on a display panel, a conductive frame that is disposed behind the display panel and supplies a frame ground, a control printed board disposed behind the conductive frame, and a conductive shield cover covering at least a part of the back face of the control printed board. The control printed board includes a front ground pad and a backside ground pad. The front ground pad is electrically connected to the back face of the conductive frame. The backside ground pad is electrically connected to the conductive shield cover. A part of an end of the conductive shield cover is electrically connected to the partial region.

12 Claims, 12 Drawing Sheets

DISPLAY DEVICE

CROSS-REFERENCE TO RELATED APPLICATIONS

This non-provisional application claims priority under 35 U.S.C. § 119 (a) on Patent Application No. 2023-069467 filed in Japan on Apr. 20, 2023, the entire content of which is hereby incorporated by reference.

BACKGROUND

This disclosure relates to a display device.

Various types of display devices are known, including liquid crystal display devices and organic light-emitting diode (OLED) display devices. The display devices are utilized in various fields and they are demanded to satisfy electromagnetic compatibility (EMC) requirements that are different depending on their application fields. Especially for on-vehicle display devices, specific EMC requirements severer than international standards tend to be regulated.

The EMC requirements are roughly categorized into requirements about the energy of the electromagnetic noise emitted from the device (emission) and requirements about the tolerance of the device against external electromagnetic noise (immunity). The emission is also referred to as electromagnetic interference (EMI). The immunity includes electromagnetic susceptibility (EMS) and electrostatic discharge (ESD) test.

SUMMARY

An aspect of this disclosure is a display device including: a display panel configured to display an image toward the front of the display panel; a driver circuit on the display panel; a conductive frame that is disposed behind the display panel and supplies a frame ground; a control printed board disposed behind the conductive frame; a flexible printed board connecting the display panel and the control printed board to transmit signals and a ground between the driver circuit and the control printed board; and a conductive shield cover covering at least a part of the back face of the control printed board. The control printed board includes a front ground pad on the front face of the control printed board and a backside ground pad on the back face of the control printed board. The front ground pad is electrically connected to the back face of the conductive frame in a region opposed to each other. The backside ground pad is electrically connected to the conductive shield cover in a region opposed to each other. A part of an end of the conductive shield cover covers a partial region of the back face of the conductive frame and is electrically connected to the partial region.

It is to be understood that both the foregoing general description and the following detailed description are exemplary and explanatory and are not restrictive of this disclosure.

EMBODIMENTS

Hereinafter, embodiments of this disclosure will be described with reference to the accompanying drawings. It should be noted that the embodiments are merely examples to implement this disclosure and not to limit the technical scope of this disclosure.

Figure 1:
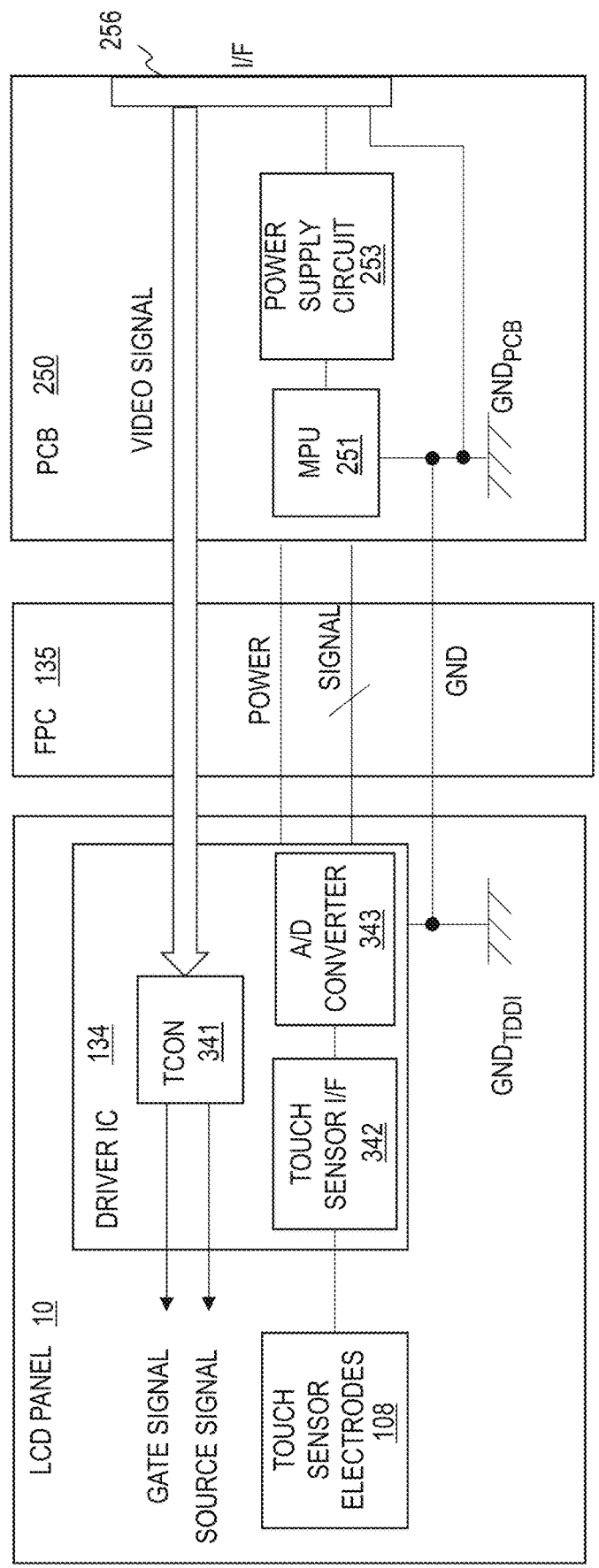
FIG. 1 is a block diagram schematically illustrating the circuit configuration of a display device in an embodiment of this specification.

FIG. 1 is a block diagram schematically illustrating the circuit configuration of a display device in an embodiment of this specification. FIG. 1 illustrates an in-cell type of liquid crystal display device having a touch sensor function as an example of a display device. As for display devices having a touch sensor function, out-cell type and in-cell type are known. The out-cell type is configured in such a manner that an external touch panel is attached to the display panel and the in-cell type is configured in such a manner that touch electrodes are incorporated within the display panel. The features of this disclosure are also applicable to out-cell type of liquid crystal display devices having a touch sensor function, other kinds of display devices such as OLED display devices and micro-LED display devices, and display devices without a touch sensor function.

The liquid crystal display device includes a liquid crystal display (LCD) panel 10, flexible printed circuits (FPC) 135, and a printed circuit board (PCB) 250. The LCD panel 10 includes touch sensor electrodes 108 and a driver IC 134. The PCB 250 includes a printed wiring board (PWB) including conductor lines laid out on and inside an insulator substrate and electronic components mounted on the PWB. The electronic components of the PCB 250 include a microprocessor unit (MPU) 251 of a processor, a power supply circuit 253, and an interface (I/F) circuit 256 for an external control device. The PCB 250 is an example of a control printed board. The PCB 250 is a rigid printed board or a flexible printed board.

The driver IC 134 includes a timing controller (TCON) 341, a touch sensor interface (circuit) 342, and an A/D converter 343. The timing controller 341 is an image display controller and the touch sensor interface 342 is a touch sensing controller. As noted from this description, the driver IC 134 is a touch display driver integration (TDDI) circuit including both of the circuit for touch sensing 342 and the circuit for displaying images 341.

The FPC 135 is a flexible printed board. The FPC 135 includes lines for transmitting a power supply potential, signals, and a ground (reference potential) between the PCB 250 and the LCD panel 10. The signals include a video signal and a signal for touch sensing.

A video signal from an external control device is input through the interface circuit 256 on the PCB 250. The video signal is input to the timing controller 341 via a line of the FPC 135. The timing controller 341 generates a gate signal (selection signal) and a source signal (data signal) and sends them to the display region (not-shown) of the LCD panel 10. The display region displays an image in accordance with the signals from the timing controller 341.

The touch sensor interface 342 supplies driving signals to the touch sensor electrodes 108 on the LCD panel 10 and receives touch sensing signals from the touch sensor electrodes 108. Various types of touch sensors are known depending on the sensing scheme; one of those is capacitive type. A capacitive type of touch sensor detects variation in capacitance between an electrode and a pointer to locate the contact point of the pointer. The capacitive type is further categorized into projected capacitive type and surface capacitive type.

An example of a projected capacitive type of touch sensor has a plurality of strip-like X-electrodes and Y-electrodes. These electrodes are touch sensor electrodes 108. The X-electrodes and the Y-electrodes are disposed in a matrix and an insulating layer is interposed between each X-electrode and each Y-electrode. When a pointer approaches X-Y electrodes, the capacitance between the electrodes increases. The location of the pointer can be detected because of variation in capacitance of the X-Y electrode lines.

There are two capacitance sensing schemes for a projected capacitive type of touch sensor: self-capacitance sensing and mutual capacitance sensing. The self-capacitance sensing scans X-electrodes and Y-electrodes independently to detect variation in capacitance of each electrode.

In a mutual capacitive touch sensor, Tx electrodes that work as driving electrodes and Rx electrodes that work as sensing electrodes are disposed to be orthogonal to each other with an insulator interposed therebetween, so that a capacitor (intersection capacitor) is configured at each intersection. The Tx electrodes and the Rx electrodes are the touch sensor electrodes 108. When a capacitor generated by a pointer exists near an intersection capacitor, the mutual capacitance at this intersection decreases by the amount of the electric charge charged into the capacitor generated by the pointer.

The touch sensor interface 342 senses which intersection exhibits how much variation of mutual capacitance. The sensed capacitance is converted by the A/D converter 343 into a digital signal and sent to the MPU 251 via the FPC 135. In an example, the signal is sent by serial transmission. The features of this embodiment are also applicable to display devices including touch sensors of any type other than the projected capacitive type employing a scheme of mutual capacitance sensing or self-capacitance sensing.

Figure 2:
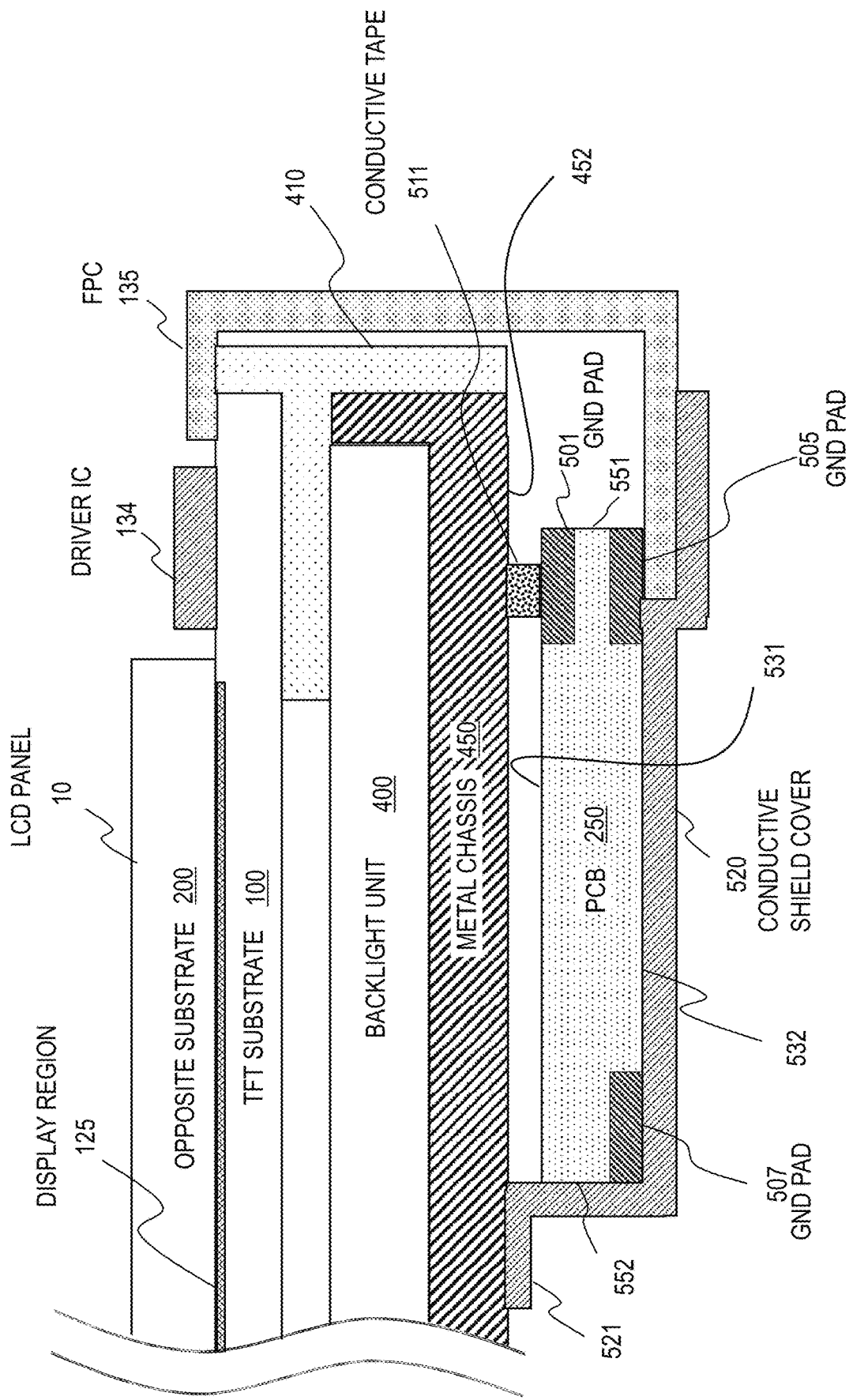
FIG. 2 schematically illustrates a structural example of a liquid crystal display device.

FIG. 2 schematically illustrates a structural example of a liquid crystal display device. FIG. 2 illustrates a part of a liquid crystal display device. The liquid crystal display device includes an LCD panel 10. The LCD panel 10 includes a thin-film transistor (TFT) substrate 100 and an opposite substrate 200. The TFT substrate 100 includes thin-film transistors, electrodes for applying electric fields to liquid crystal, and touch sensor electrodes 108 (not shown in FIG. 2) fabricated thereon. The TFT substrate 100 and the opposite substrate 200 are bonded together along a sealing region. Liquid crystal material is encapsulated between the TFT substrate 100 and the opposite substrate 200.

A driver IC 134 is disposed outside a display region 125 of the TFT substrate 100. The display region 125 is a region for displaying images. In this configuration example, the display region 125 is also a touch sensing region for detecting a touch point of a pointer. The driver IC 134 is electrically connected to the circuits on the PCB 250 via flexible printed circuits (FPC) 135. In this example, the PCB 250 is a rigid printed board and the FPC 135 is a flexible printed board. The driver IC 134 is mounted on the TFT substrate 100 with an anisotropic conductive film (ACF), for example.

The user views a displayed image from over the opposite substrate 200. Hereinafter, the side where the user viewing an image is located is defined as front and the opposite side as back. The TFT substrate 100 can be disposed on the front of the LCD panel 10 and the opposite substrate 200 can be disposed on the back.

A backlight unit 400 is disposed behind the LCD panel 10. The backlight unit 400 includes one or more light sources and optical components for producing planar light from the light emitted from the light sources. Various configurations are widely known for the backlight unit 400; description of the specifics is skipped herein.

Figure 3:
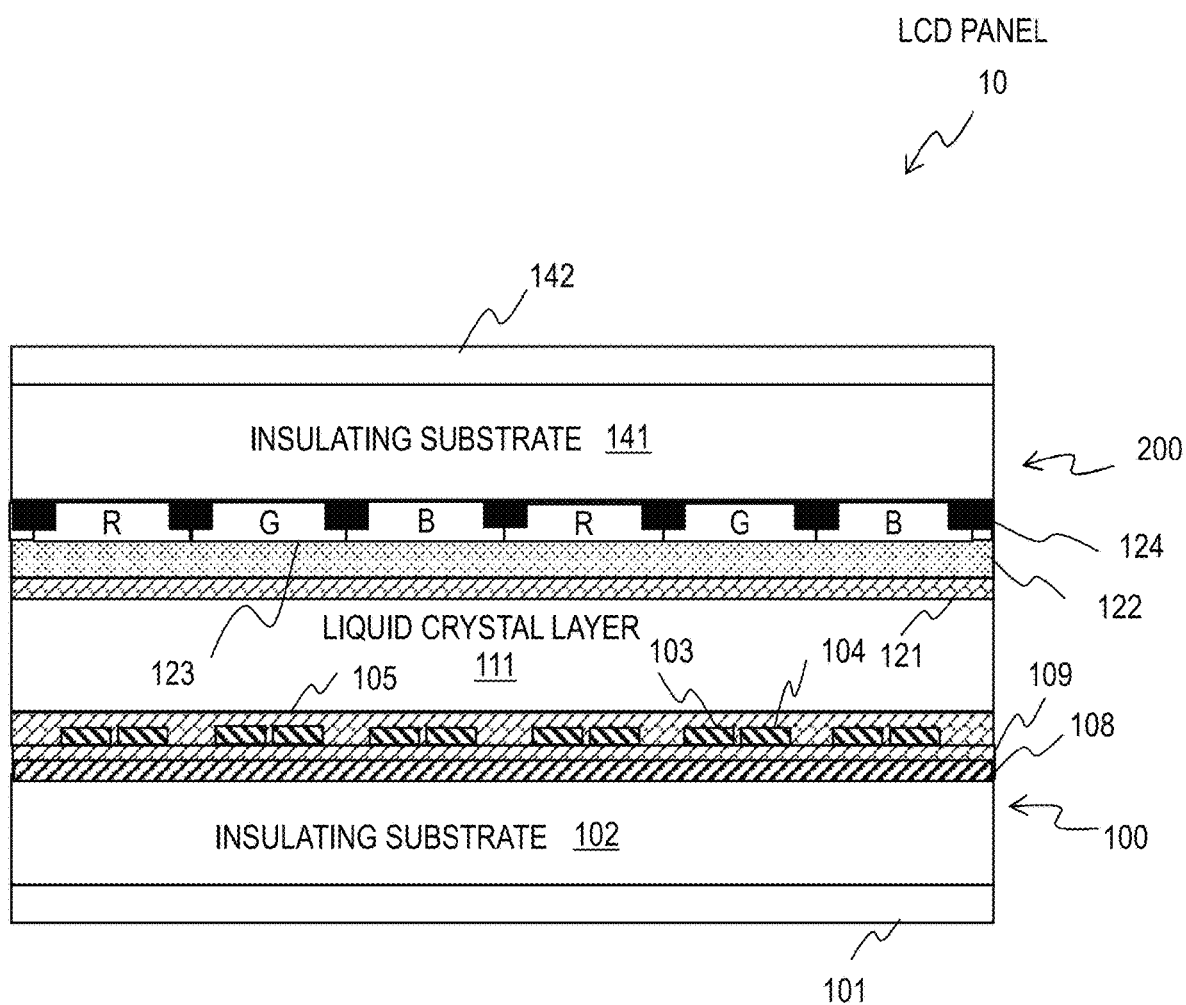
FIG. 3 schematically illustrates a cross-sectional structure of an LCD panel.

FIG. 3 schematically illustrates the cross-sectional structure of the LCD panel 10. FIG. 3 illustrates the configuration of a part of the LCD panel 10 and omits the configuration of the other part. The LCD panel 10 includes a TFT substrate 100 and an opposite substrate 200 opposed to the TFT substrate 100. A liquid crystal layer 111 is interposed between the TFT substrate 100 and the opposite substrate 200.

The TFT substrate 100 includes an insulating substrate 102. The insulating substrate 102 is a transparent insulating substrate made of glass or resin. An example of the insulating substrate 102 has a rectangular shape and one of its main faces is opposed to one of the main faces of the opposite substrate 200. A polarizing plate 101 is attached on the other main face of the insulating substrate 102 opposite from the liquid crystal layer 111.

Touch sensor electrodes 108 are arrayed on the main face of the insulating substrate 102 facing the liquid crystal layer 111. As described above, the touch sensor electrodes 108 can include Tx electrodes as driving electrodes and Rx electrodes as sensing electrodes that are disposed to be orthogonal to each other with an insulator interposed therebetween. The touch sensor electrodes 108 are covered with an insulating layer 109.

Driving electrodes (also referred to as pixel electrodes) 103 for applying electric fields to the liquid crystal layer 111 and common electrodes (also referred to as opposite electrodes) 104 are arrayed on the insulating layer 109. A pair of a driving electrode 103 and a common electrode 104 applies an electric field to the liquid crystal of one pixel. The amount of light transmitted through the pixel varies depending on the applied electric field. A not-shown TFT array for selecting pixels to be controlled is fabricated on the insulating substrate 102.

The configuration example in FIG. 3 is a horizontal electric field control type of LCD panel. The horizontal electric field control type of LCD panel can be an in-plane switching (IPS) type or a fringe field switching (FFS) type of LCD panel. In FIG. 3, the driving electrode and the common electrode of only one of the plurality of pixels are provided with reference signs 103 and 104, respectively.

An alignment film 105 is laid to cover the electrode layer including the driving electrodes 103 and the common electrodes 104. The alignment film 105 is in contact with the liquid crystal layer 111 and defines the orientation (initial alignment) of the liquid crystal molecules when no electric field is applied.

The opposite substrate 200 in the configuration example in FIG. 3 is a color filter (CF) substrate including color filters. The opposite substrate 200 does not need to include color filters. The opposite substrate 200 includes an insulating substrate 141 made of glass or resin. An example of the insulating substrate 141 has a rectangular shape. A polarizing plate 142 is attached on the main face of the insulating substrate 141 opposite from the liquid crystal layer 111.

A latticed black matrix 124 for defining pixels is laid on the main face of the insulating substrate 141 facing the liquid crystal layer 111. The black matrix 124 is a thin film made of black resin or a chromium-based metal. A red, green, or blue color filter 123 is provided in each pixel region surrounded by the black matrix 124.

An insulating overcoat layer 122 is laid on the color filters 123. The overcoat layer 122 is optional. An alignment film 121 is laid on the overcoat layer 122. The alignment film 121 is in contact with the liquid crystal layer 111 and defines the orientation (initial alignment) of the liquid crystal molecules when no electric field is applied. The opposite substrate 200 can be provided with an antistatic layer unless it interferes with touch sensing.

The liquid crystal layer 111 controls the amount of the light from the backlight unit 400 to be transmitted through each pixel in accordance with the electric filed between the driving electrode 103 and the common electrode 104 for the pixel. The driver IC 134 controls the potentials of the driving electrode 103 and the common electrode 104 for each pixel. The driver IC 134 controls the potentials of the driving electrode 103 and the common electrode 104 for each pixel in accordance with image data to control the amount of light to be transmitted through the pixel.

Returning to FIG. 2, the backlight unit 400 is enclosed in the space inside a metal chassis 450. The backlight unit 400 is located on the front of the metal chassis 450. The metal chassis 450 can be made of stainless steel or aluminum. The metal chassis 450 is a conductor frame having a volume enough to supply a frame ground (reference potential). The metal chassis 450 and the LCD panel 10 are fixed by a resin or metal frame 410. A part of the frame 410 is interposed between the TFT substrate 100 and the backlight unit 400 to prevent a break caused by their contact.

A PCB 250 is disposed behind the metal chassis 450. The PCB 250 includes a rigid PWB and electronic components on the PWB described with reference to FIG. 1 (they are not shown in FIG. 2). The PWB includes a rigid insulating substrate and a plurality of conductive line layers on and inside the insulating substrate. Each line layer can be made of copper. FIG. 2 shows ground pads (GND pads) 501, 505, and 507 of the PCB 250. The ground pads 501, 505, and 507 are included in a ground layer for supplying a ground in the PCB 250. The pads are electrodes.

The ground pad 501 is a front ground pad provided on the front face 531 of the PCB 250. The ground pads 505 and 507 are backside ground pads provided on the back face 532 of the PCB 250. In this description, the front is the side closer to the LCD panel 10 and the back is the opposite side. The front face 531 is the main face on the front side and the back face 532 is the main face on the back side.

The signal ground layer including the ground pad 501 and the signal ground layer including the ground pads 505 and 507 are electrically connected through a via hole. The surfaces of the ground pads can be coated with gold. The multilayer structure of the PCB 250 will be described later.

The ground pads 501 and 505 are located in a side region (first side region) 551 of the PCB 250. A side region is an end region of the PCB 250 and includes an end face and the vicinity thereof. The PCB 250 in a configuration example has a rectangular shape. The shape of the PCB 250 can be a rectangle or a shape other than a rectangle. The ground pad 501 is a front ground pad disposed on the front face of the PCB 250 and the ground pad 505 is a backside ground pad disposed on the back face of the PCB 250.

The ground pad 501 is electrically connected to the back face 452 of the metal chassis 450 in the region opposed to each other. In the example illustrated in FIG. 2, the ground pad 501 is electrically connected to the metal chassis 450 via a conductive tape 511 in the region opposed to each other.

The ground pad 501 can be electrically connected to its opposite region of the metal chassis 450 either via the conductive tape 511 as shown in FIG. 2 or directly without the conductive tape 511 by physically and electrically being in contact with the metal chassis 450.

The conductive tape 511 is in direct contact with the back face of the metal chassis 450 and the front face of the ground pad 501 and sticks to them. The ground pad 501 is electrically connected to the metal chassis 450 by the conductive tape 511. The conductive tape 511 is a double-sided adhesive tape having conductivity. An example of the conductive tape 511 is configured in such a manner that adhesive layers containing a conductive filler (metallic particles) are provided on both sides of a thin flexible conductive sheet. The thin flexible conductive sheet can be a metal sheet made of aluminum or copper or a conductive fabric produced by coating a fabric with a metal. The conductive sheet is optional for electrical connection with a conductive adhesive. The adhesive in this description is a material for bonding two objects and includes both of a material that keeps the bonded state of the objects and a material that changes the states of the objects before and after they are bonded.

In the example in FIG. 2, the adhesive region of the conductive tape 511 is incorporated into the front face of the ground pad 501 and has a smaller area than the front face of the ground pad 501. The conductive tape 511 is in contact with a part of the front face of the ground pad 501 and its opposite region of the metal chassis 450.

The resistance between the ground pad 501 and the metal chassis 450 or the resistance in the direction of the thickness of the conductive tape can be adjusted by adjusting the size of the conductive tape 511. Specifically, the resistance can be increased by reducing the size of the conductive tape 511.

The ground pads 501 and 505 are disposed on the side where the FPC 135 is connected to the PCB 250. The ground pad 507 is disposed opposite from the ground pad 505 on the back face of the PCB 250. The ground pad 501 is disposed on the front face 531 in the side region 551 of the PCB 250; the ground pad 505 is disposed on the back face 532 in the side region 551 of the PCB 250; and the ground pad 507 is disposed on the back face 532 in the side region 552 of the PCB 250 located opposite from of the side region 551.

The FPC 135 includes a flexible insulating resin sheet and conductor line patterns (including electrodes) formed on and inside the resin sheet. The resin can be polyimide and the material of the lines can be copper. The electrodes exposed at one end of the FPC 135 are electrically and physically connected to electrodes on the TFT substrate 100. The electrodes exposed at the other end are electrically and physically connected to one or more electrodes disposed along the side region 551 of the PCB 250. Connection between an electrode of the FPC 135 and an electrode of another component can be made by crimping, soldering, or an ACF. The exposed electrodes of the FPC 135 and the PCB 250 can be coated with gold.

In order to illustrate the ground pads 501, 505, and 507 and the conductive tape 511, the location of the cross-section of the PCB 250 in FIG. 2 is different in relation to the locations of the cross-sections of the other components. FIG. 2 looks as if the front face of an end region of the FPC 135 is in contact with the backside ground pad 505. Actually, however, the front face of the end region of the FPC 135 is distant from the ground pad 505 and they are not in contact with each other, as will be described later with reference to FIG. 4.

A conductive shield cover 520 covers the entirety or a part of the back face of the PCB 250 and further, covers a part of the FPC 135. The conductive shield cover 520 can be a single-sided conductive adhesive tape. For example, the conductive shield cover 520 is configured in such a manner that an adhesive layer containing a conductive filler (metallic particles) is provided on one side of a thin flexible conductive sheet (e.g., an aluminum sheet). The adhesive face sticks to the back face of the PCB 250 and the FPC 135.

The conductive shield cover 520 is electrically connected to the backside ground pads 505 and 507 in the regions opposed to each other. In the example in FIG. 2, the backside ground pads 505 and 507 are physically and electrically in direct contact with the conductive shield cover 520. The number of backside ground pads to be electrically in contact with the conductive shield cover 520 can be one or any plural number.

The conductive shield cover 520 covers the side region 552 of the PCB 250 and further, a part of the back face of the metal chassis 450. One end region 521 of the conductive shield cover 520 is electrically connected to the back face of the metal chassis 450 in the region in contact with each other. As illustrated in FIG. 2, the end region 521 is in contact with and electrically connected to the back face of the metal chassis 450 on the opposite side of the side region 551 where the FPC 135 is connected.

Figure 4:
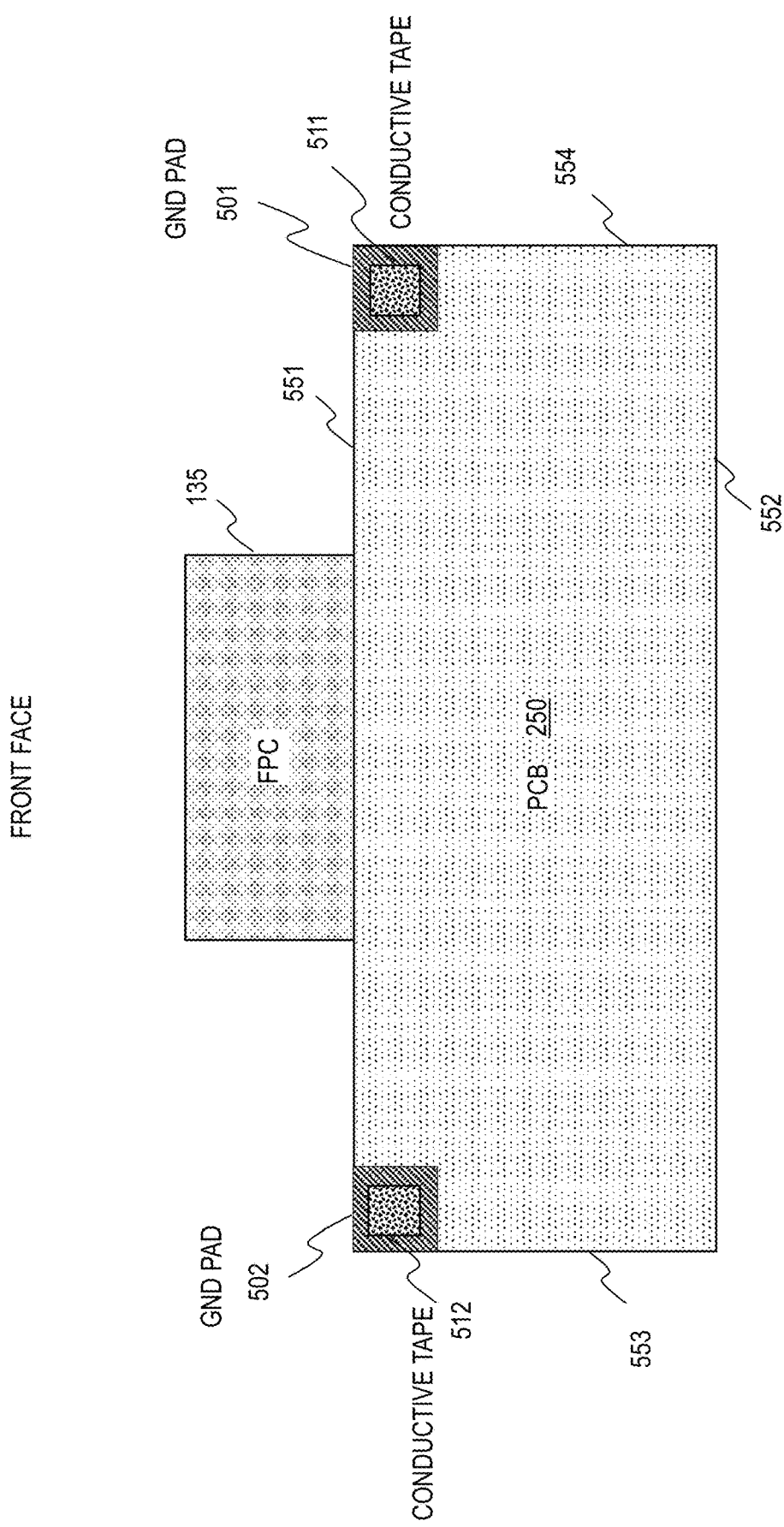
FIG. 4 is a plan diagram illustrating the front face of a PCB and the first main face of FPC.

FIG. 4 is a plan diagram illustrating the front face of the PCB 250 and the first main face of the FPC 135. The front face of the PCB 250 is the main face facing the back face of the metal chassis 450. A part of the first main face of the FPC 135 is connected to the PCB 250 on the back face (which is not shown in FIG. 4) of the PCB 250. The PCB 250 in the example of FIG. 4 has a rectangular shape. The side regions 553 and 554 are opposed to each other. The side regions 553 and 554 have a shorter length than the side regions 551 and 552.

The ground pad 501 is disposed at the corner between the side regions 551 and 554 of the PCB 250. The ground pad 501 is disposed in the vicinity of the side regions 551 and 554. The ground pad 501 can be either exposed or not exposed at the end faces of the side regions 551 and 554. The ground pad 501 can be slightly distant from at least one of the side regions 551 and 554 on the front face of the PCB 250.

Another ground pad 502 is disposed at the corner between the side regions 551 and 553 of the PCB 250. The ground pad 502 is disposed in the vicinity of the side regions 551 and 553. The ground pad 502 can be either exposed or not exposed at the end faces of the side regions 551 and 553. The ground pad 502 can be slightly distant from at least one of the side regions 551 and 553 on the front face of the PCB 250.

The conductive tape 511 covers a part of the front face of the ground pad 501. The conductive tape 511 can cover the entire front face of the ground pad 501. A conductive tape 512 covers a part of the front face of the ground pad 502. The conductive tape 512 can cover the entire front face of the ground pad 502. The conductive tape 512 is in contact with the back face of the metal chassis 450 in the region opposed to each other to electrically connect the metal chassis 450 and the ground pad 502. The shapes and the sizes of the conductive tapes 511 and 512 can be equal or different.

Figure 5:
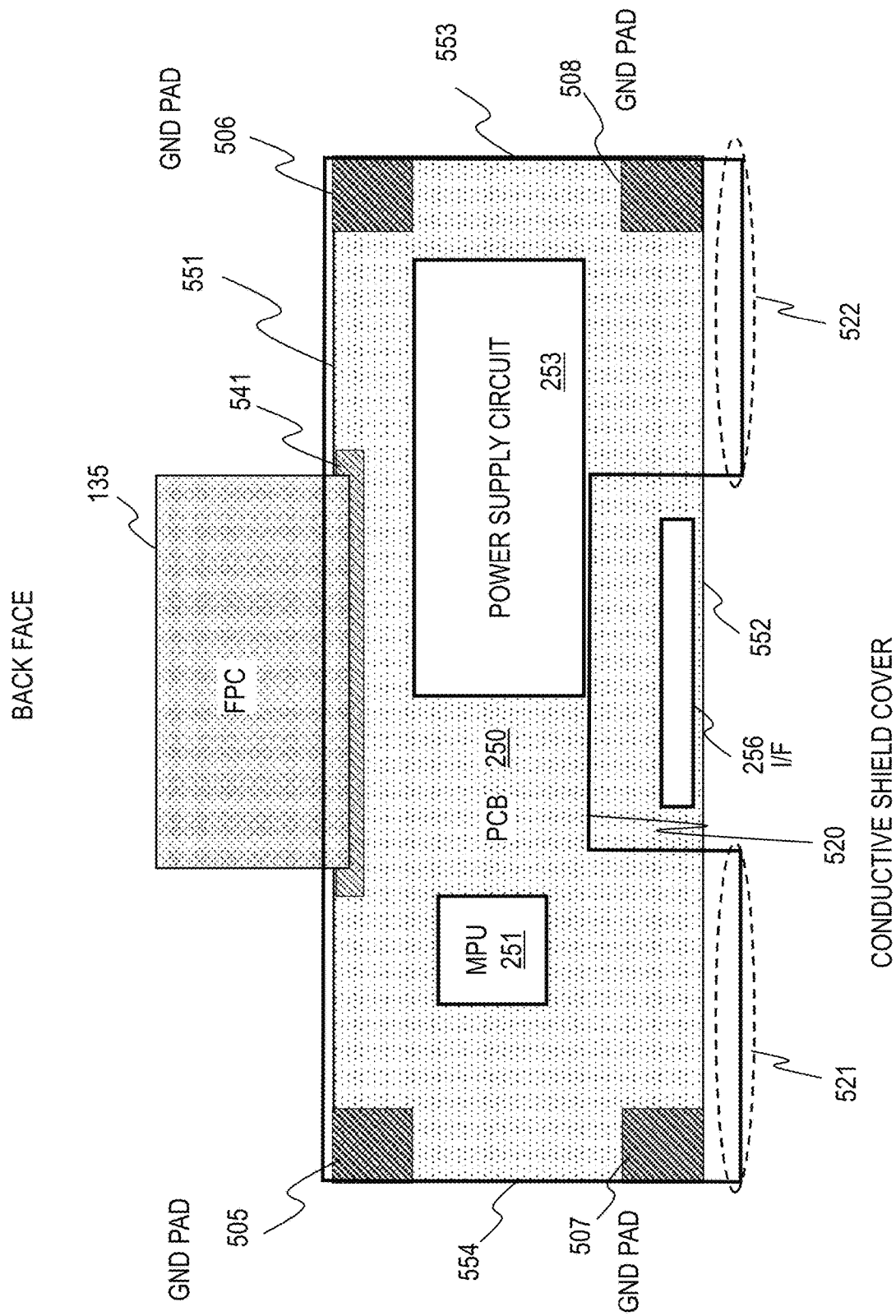
FIG. 5 is a plan diagram illustrating the back face of the PCB, the second main face of the FPC, and the back face of a conductive shield cover.

FIG. 5 is a plan diagram illustrating the back face of the PCB 250, the second main face of the FPC 135, and the back face of the conductive shield cover 520. For convenience of illustration, the conductive shield cover 520 is indicated by a solid line representing its outline. The back face of the PCB 250 is the opposite main face of the front face and the second main face of the FPC 135 is the opposite main face of the first main face.

The PCB 250 includes four backside ground pads 505 to 508. The PCB 250 includes an MPU 251 and a power supply circuit 253. Within the rectangle representing the power supply circuit 253, other kinds of circuits can be mounted together. The PCB 250 includes a connector region 541 to be connected to the electrodes of the FPC 135 in the side region 551. Electrodes exposed in the connector region 541 are electrically and physically connected to the exposed electrodes of the FPC 135. The electrodes to be connected include electrodes for transmitting a ground and power as well as electrodes for transmitting signals for image display and touch sensing.

The ground pad 505 is disposed at the corner between the side regions 551 and 554 of the PCB 250. The ground pad 505 is disposed in the vicinity of the side regions 551 and 554. The ground pad 505 can be either exposed or not exposed at the end faces of the side regions 551 and 554. The ground pad 505 can be slightly distant from at least one of the side regions 551 and 554 on the back face of the PCB 250.

The ground pad 506 is disposed at the corner between the side regions 551 and 553 of the PCB 250. The ground pad 506 is disposed in the vicinity of the side regions 551 and 553. The ground pad 506 can be either exposed or not exposed at the end faces of the side regions 551 and 553. The ground pad 506 can be slightly distant from at least one of the side regions 551 and 553 on the back face of the PCB 250.

The ground pad 507 is disposed at the corner between the side regions 552 and 554 of the PCB 250. The ground pad 507 is disposed in the vicinity of the side regions 552 and 554. The ground pad 507 can be either exposed or not exposed at the end faces of the side regions 552 and 554. The ground pad 507 can be slightly distant from at least one of the side regions 552 and 554 on the back face of the PCB 250.

The ground pad 508 is disposed at the corner between the side regions 552 and 553 of the PCB 250. The ground pad 508 is disposed in the vicinity of the side regions 552 and 553. The ground pad 508 can be either exposed or not exposed at the end faces of the side regions 552 and 553. The ground pad 508 can be slightly distant from at least one of the side regions 552 and 553 on the back face of the PCB 250.

The conductive shield cover 520 covers a part of the FPC 135 and a part of the PCB 250. In the configuration example in FIG. 5, the conductive shield cover 520 has an indent so as not to cover the interface circuit 256. The conductive shield cover 520 can cover the entire back face of the PCB 250, if the design allows.

The conductive shield cover 520 is electrically connected to a signal ground layer of the PCB 250. In the example in FIG. 5, the conductive shield cover 520 is physically in direct contact with the ground pads 505 to 508 to make electrical connection. A conductive member can be interposed between the conductive shield cover 520 and a ground pad. The conductive shield cover 520 is electrically connected to the conductor layers of the PCB 250 only at the ground pads 505 to 508.

As described with reference to FIG. 2, a part of the conductive shield cover 520 covers a part of the back face 452 of the metal chassis 450 and is electrically connected to the covered region of the metal chassis 450. In the configuration example in FIG. 5, end regions 521 and 522 of the conductive shield cover 520 each cover a part of the side region 552 of the PCB 250 and further, a partial region of the back face 452 of the metal chassis 450 that is facing the side region 552 of the PCB 250.

The end regions 521 and 522 are electrically connected to the metal chassis 450 in the above-described partial regions of the back face 452 of the metal chassis 450. The end regions 521 and 522 are physically in contact with the back face 452 of the metal chassis 450 and electrical connection is established in the contact regions.

In the configuration example in FIG. 5, the conductive shield cover 520 is electrically connected to the back face of the metal chassis 450 only in the partial regions facing the side region 552 of the PCB 250. In other words, the conductive shield cover 520 is spread to the side regions 551, 553, and 554 and it is not in contact with the back face 452 of the metal chassis 450 beyond the side regions 551, 553, and 554. There is no end region of the conductive shield cover 520 that is in contact with a region of the back face 452 of the metal chassis 450 facing the side region 551, 553, or 554. The conductive shield cover 520 can be in contact with the back face 452 of the metal chassis 450 in an end region other than the end regions 521 and 522 that extends over a side region of the PCB 250.

Figure 6:
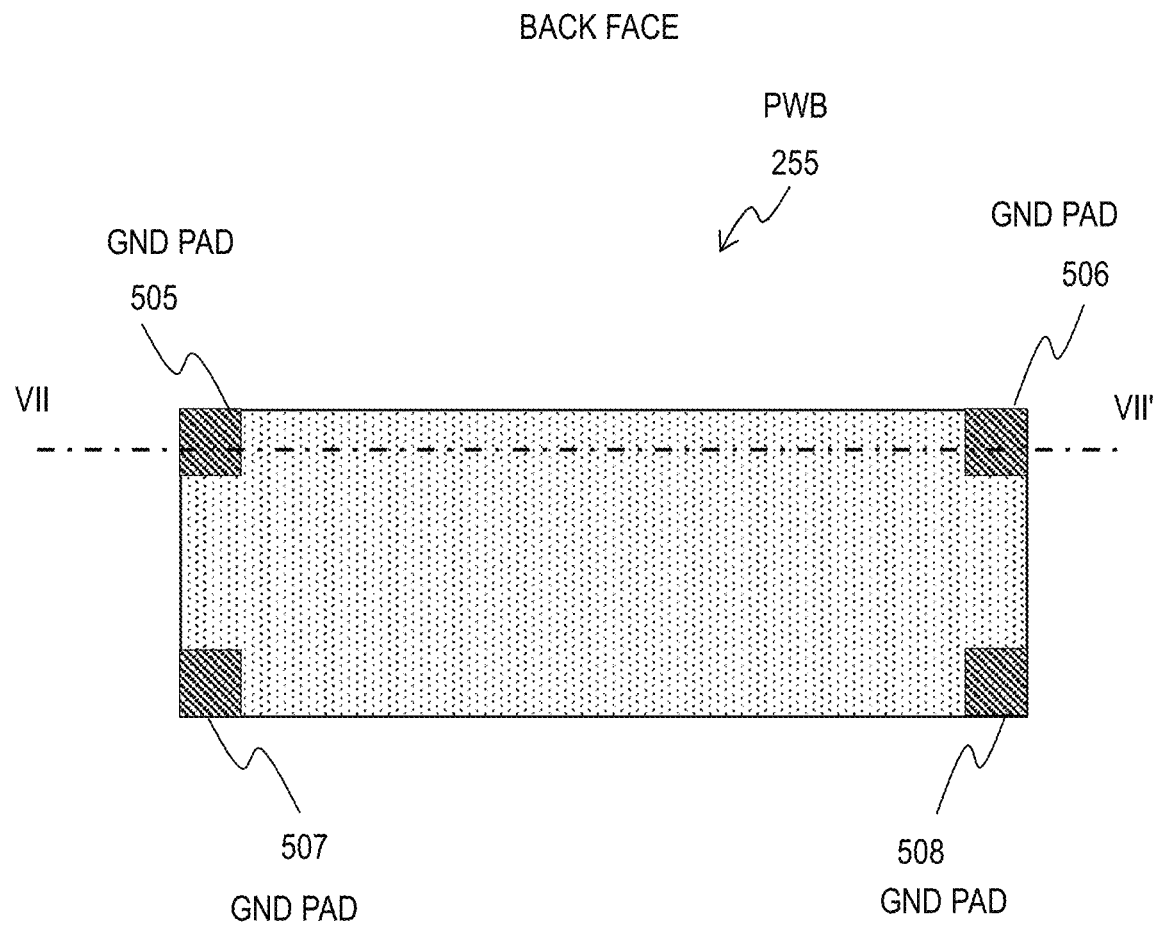
FIG. 6 is a plan diagram illustrating the back face of a PWB of the PCB.

The following describes the structure of the PWB of the PCB 250. FIG. 6 is a plan diagram illustrating the back face of the PWB 255 of the PCB 250. As described with reference to FIG. 5, the PWB 255 includes four backside ground pads 505 to 508 disposed at the corners of the back face.

Figure 7:
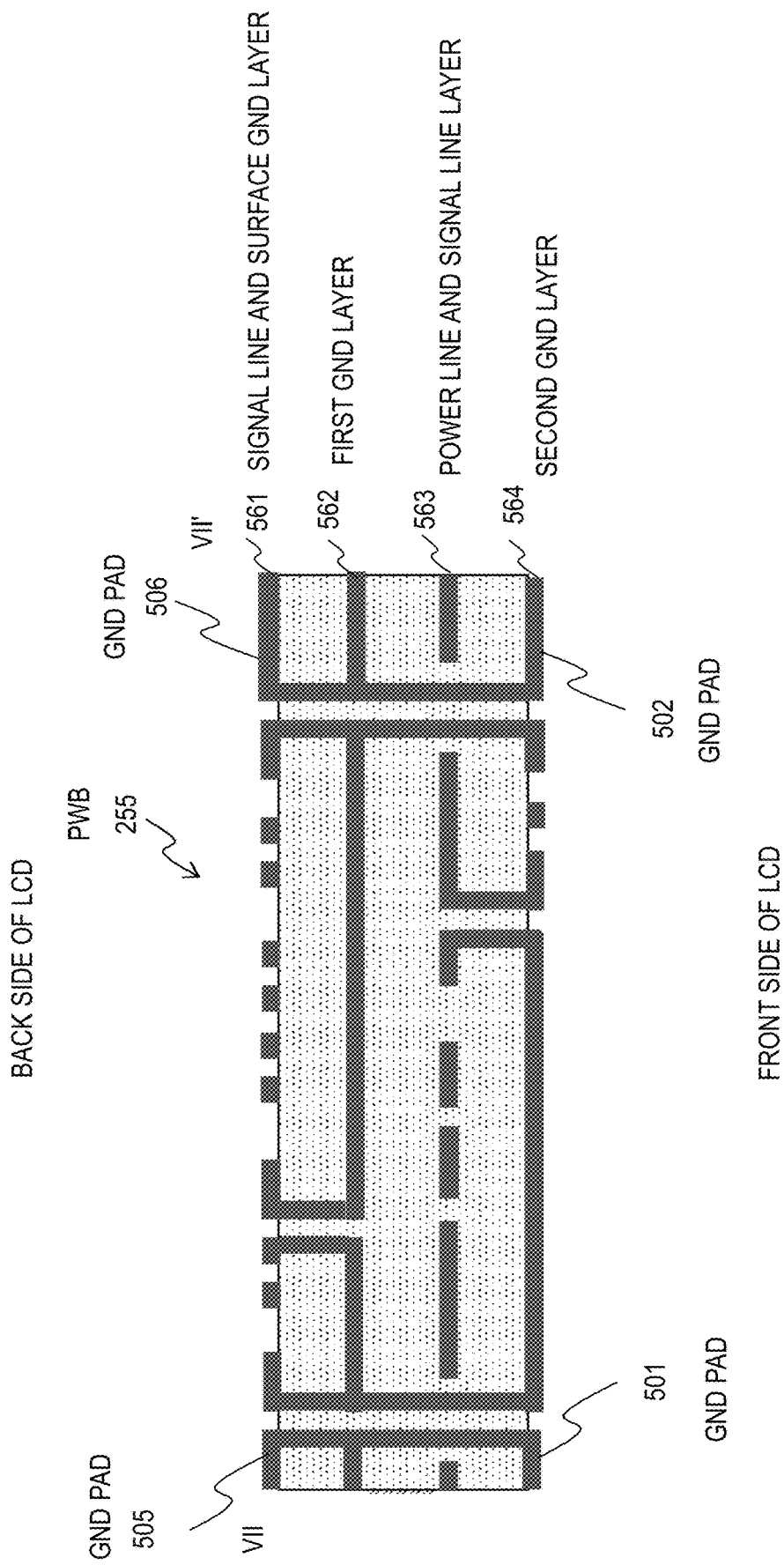
FIG. 7 schematically illustrates the cross-sectional structure along the section line VII-VII' in FIG. 6.

FIG. 7 schematically illustrates the cross-sectional structure along the section line VII-VII' in FIG. 6. The PWB 255 is a multilayer printed board and the example of the layered structure in FIG. 7 has four conductor layers. The four conductor layers are a signal line and surface ground layer 561, a first ground layer 562, a power line and signal line layer 563, and a second ground layer 564.

The front ground pads 501 and 502 are included in the second ground layer 564. The backside ground pads 505 and 506 are included in a ground line region of the signal line and surface ground layer 561. The second ground layer 564, the first ground layer 562, and the ground line region of the signal line and surface ground layer 561 are physically and electrically connected through a plurality of vias.

Figure 8:
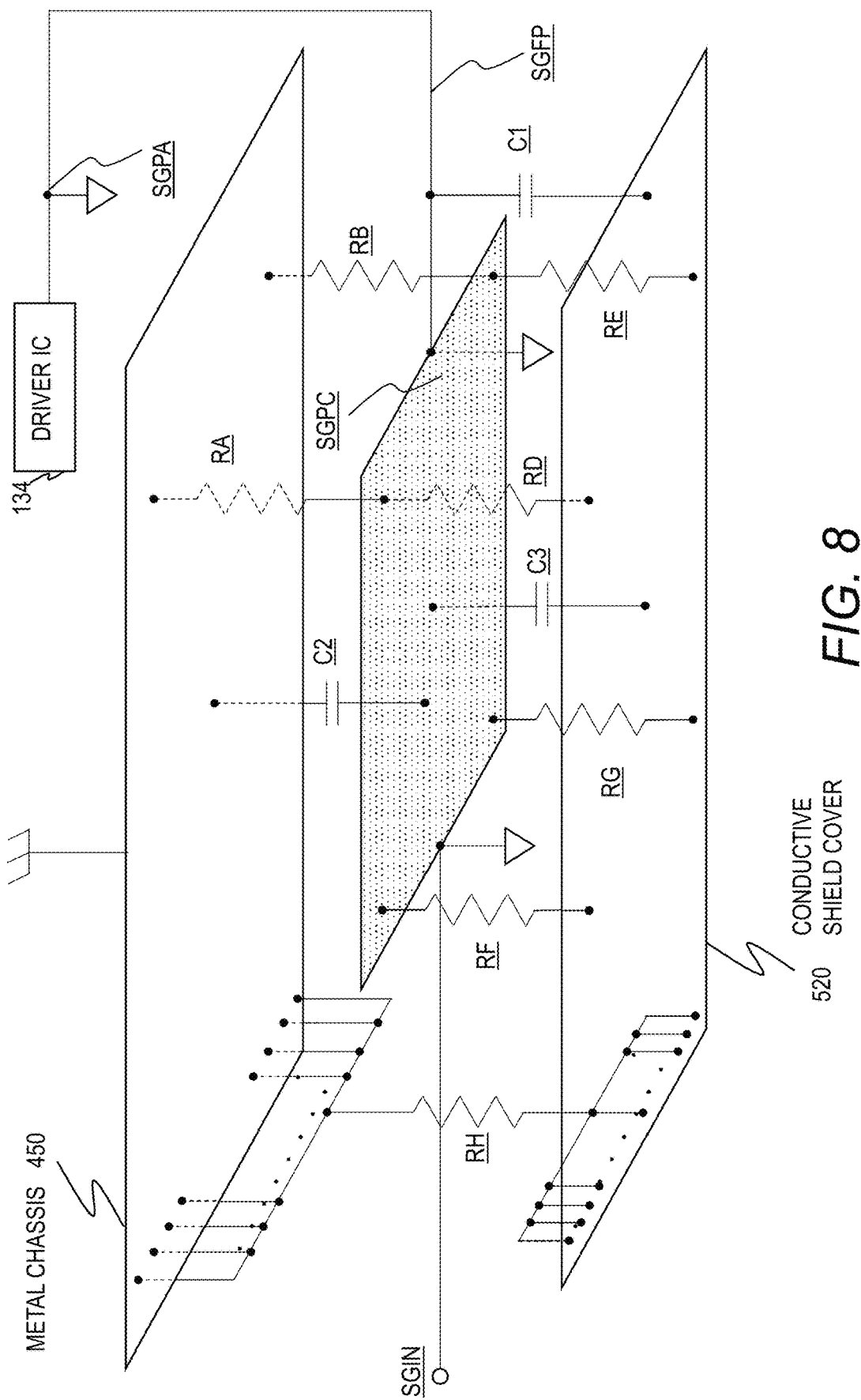
FIG. 8 illustrates the configuration of ground connection of a liquid crystal display device in an embodiment of this specification.

FIG. 8 illustrates the configuration of ground connection of a liquid crystal display device in an embodiment of this specification. As described above, a signal ground line SGFP of the FPC 135 is electrically connected to a signal ground line SGPA of the LCD panel 10 and a signal ground layer SGPC of the PCB 250. Although the PCB 250 includes a plurality of ground layers as described with reference to FIG. 7, they are collectively indicated as the signal ground layer SGPC in FIG. 8.

Resistors RA and RB are generated between the metal chassis 450 and the ground pads 501 and 502, respectively, of the signal ground layer SGPC. These resistors have a resistance of several to tens of ohms. A coupling capacitor C2 is generated between the signal ground layer SGPC and the metal chassis 450.

Resistors RD, RE, RF, and RG are generated between the conductive shield cover 520 and the ground pads 505, 506, 507, and 508, respectively, of the signal ground layer SGPC. A coupling capacitor C1 is generated between the conductive shield cover 520 and the signal ground line SGFP of the FPC 135. A coupling capacitor C3 is generated between the conductive shield cover 520 and the signal ground layer SGPC of the PCB 250. The signal ground layer SGPC of the PCB 250 is electrically connected to an input ground line SGIN extending from an external control circuit.

The electrical connection between the metal chassis 450 and the conductive shield cover 520 includes a resistor RH. As described above, the metal chassis 450 and the conductive shield cover 520 are electrically connected by a conductive adhesive in the regions in contact with each other on the opposite side of the connector region 541 where the FPC 135 is connected (on the side closer to the interface 256). In an example, the resistors RD, RE, RF, and RG have higher resistance than the resistors RA and RB. The resistor RH has higher resistance than the resistors RD, RE, RF, and RG.

Figure 9:
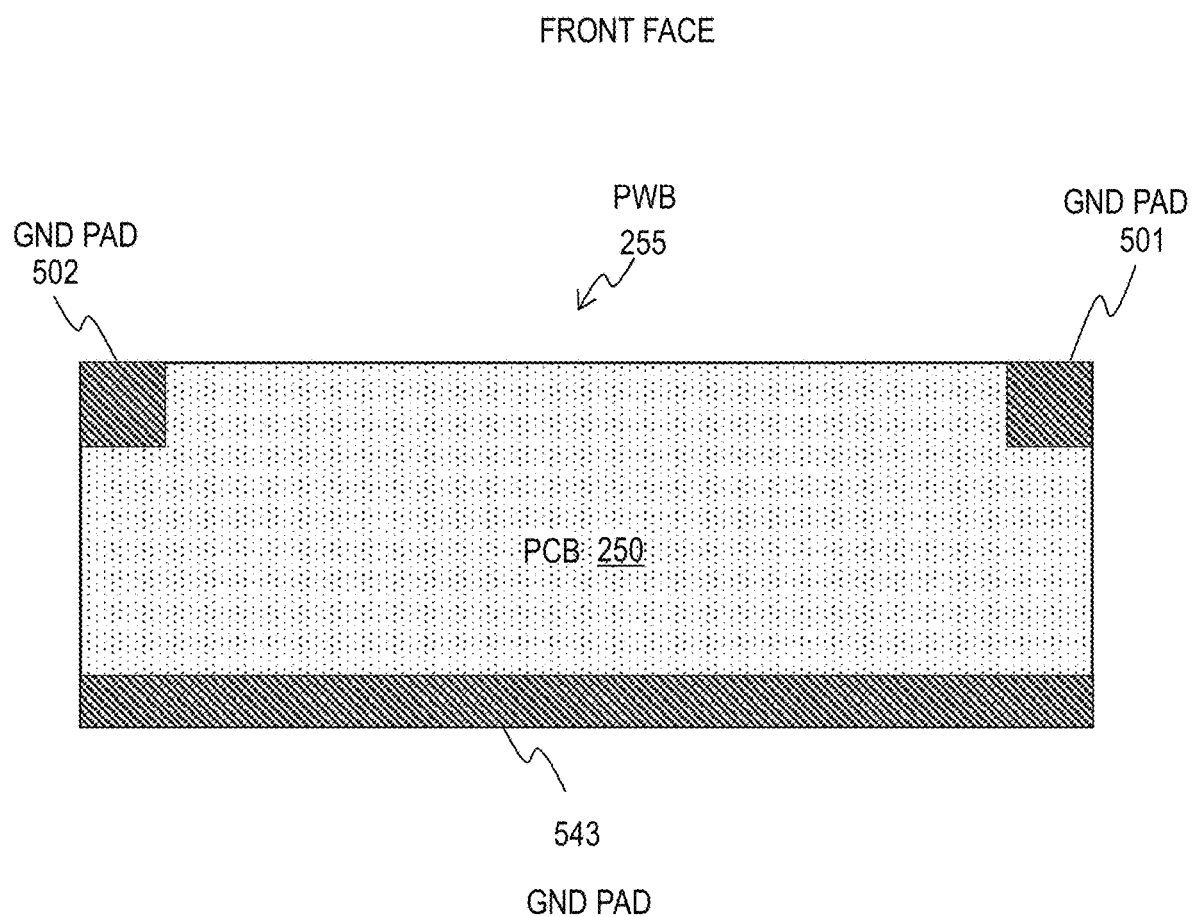
FIG. 9 illustrates a layout of front ground pads of a PWB used in measurement.

Next, measurement results on the electromagnetic interference (EMI) of a display device in an embodiment of this specification are described. FIG. 9 illustrates a layout of front ground pads of a PWB 255 used in the measurement. In addition to the front ground pads 501 and 502 shown in FIG. 4, the PWB 255 includes another ground pad 543 on the opposite side.

The inventors measured the EMI under different electrical connection configurations of the front ground pads 501, 502, and 543 to the metal chassis 450.

In the first connection configuration, all the front ground pads 501, 502, and 543 were electrically connected to the metal chassis 450. In the second connection configuration, only the front ground pads 502 and 543 were electrically connected to the metal chassis 450. In the third connection configuration, only the front ground pads 501 and 543 were electrically connected to the metal chassis 450. In the fourth connection configuration, only the front ground pads 501 and 502 were electrically connected to the metal chassis 450.

Figure 10:
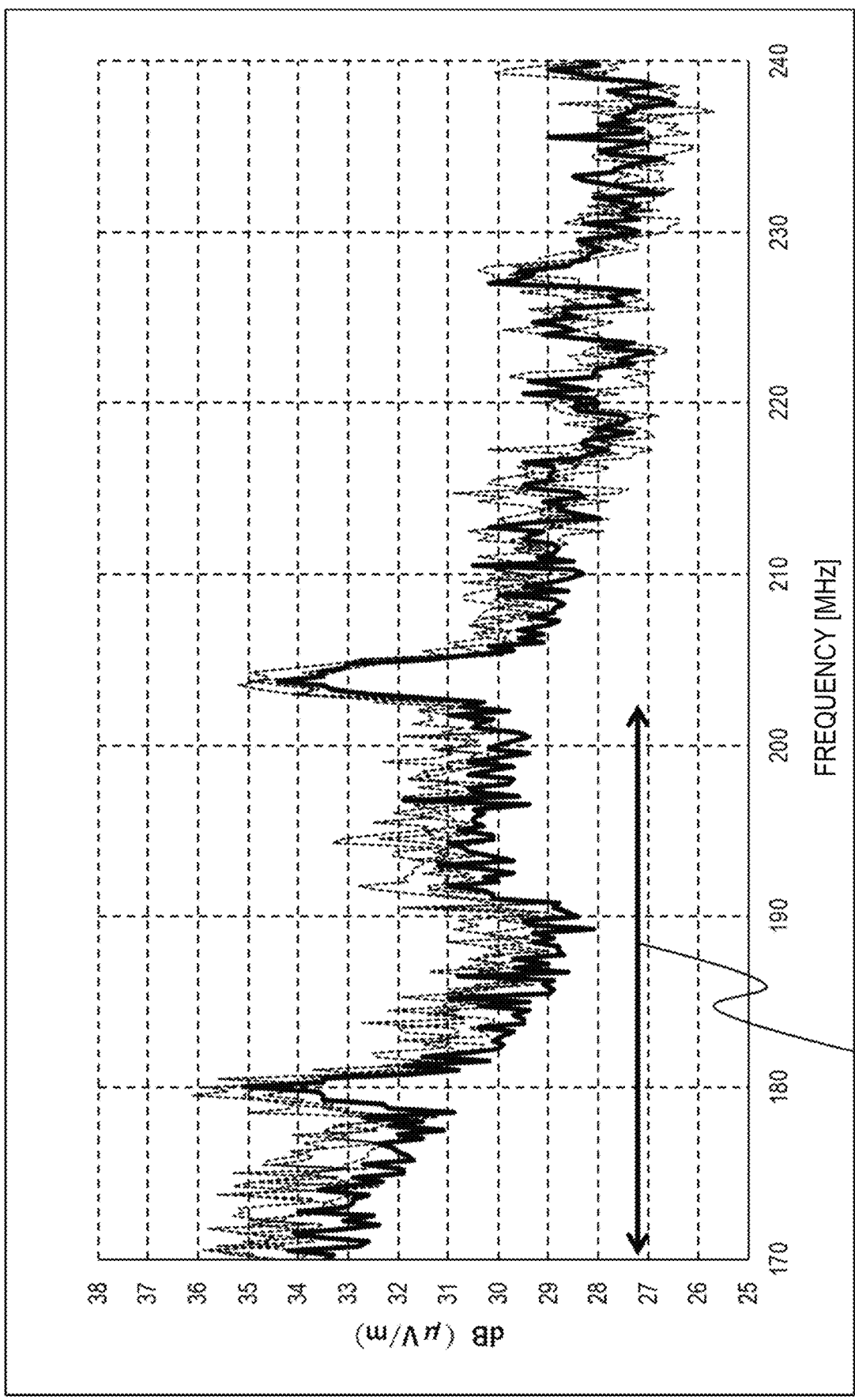
FIG. 10 provides measurement results.

FIG. 10 provides measurement results. In the graph of FIG. 10, the horizontal axis represents the frequency of EMI and the vertical axis represents the intensity of the EMI. The line with arrows 601 represents the frequency range of the EMI the device is required to suppress. In the graph, the solid line represents the EMI in the fourth connection configuration and the other broken lines represents the EMI in the other connection configurations. The measurement results in FIG. 10 indicate that the fourth connection configuration achieves the smallest EMI in the frequency range 601. The fourth connection configuration is equivalent to the configuration described with reference to FIG. 4.

In the following, examples of adjustment of the electrical contact area between a ground pad and the conductive shield cover 520 or the metal chassis 450 are described. The conductive region in the surface of a ground pad can be adjusted easily by attaching an insulating sheet on the surface of the ground pad.

Figure 11:
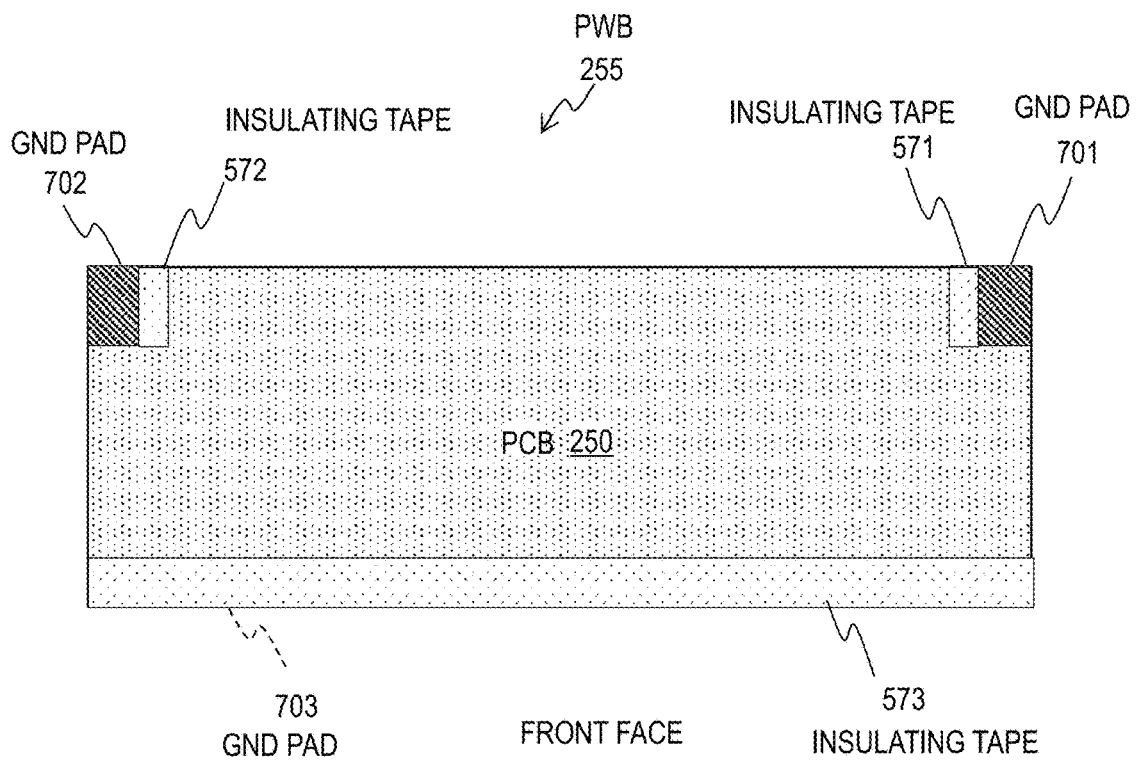
FIG. 11 illustrates an example of adjustment of the conductive regions of front ground pads.

FIG. 11 illustrates an example of adjustment of the conductive regions of front ground pads. The surfaces of front ground pads 701 and 702 located at corners are partially covered with insulating tapes 571 and 572, respectively. The exposed conductive regions contact the back face 452 of the metal chassis 450 directly or via a conductive tape. The resistance between the front ground pad 701 and the metal chassis 450 and the resistance between the front ground pad 702 and the metal chassis 450 can be adjusted by adjusting the areas of the insulating tapes 571 and 572. An insulating tape 573 covers the entire region of a ground pad 703 thereunder. These insulating tapes can disconnect the electrical connection between a pad in the ground line region and a conductive member opposed thereto.

Figure 12:
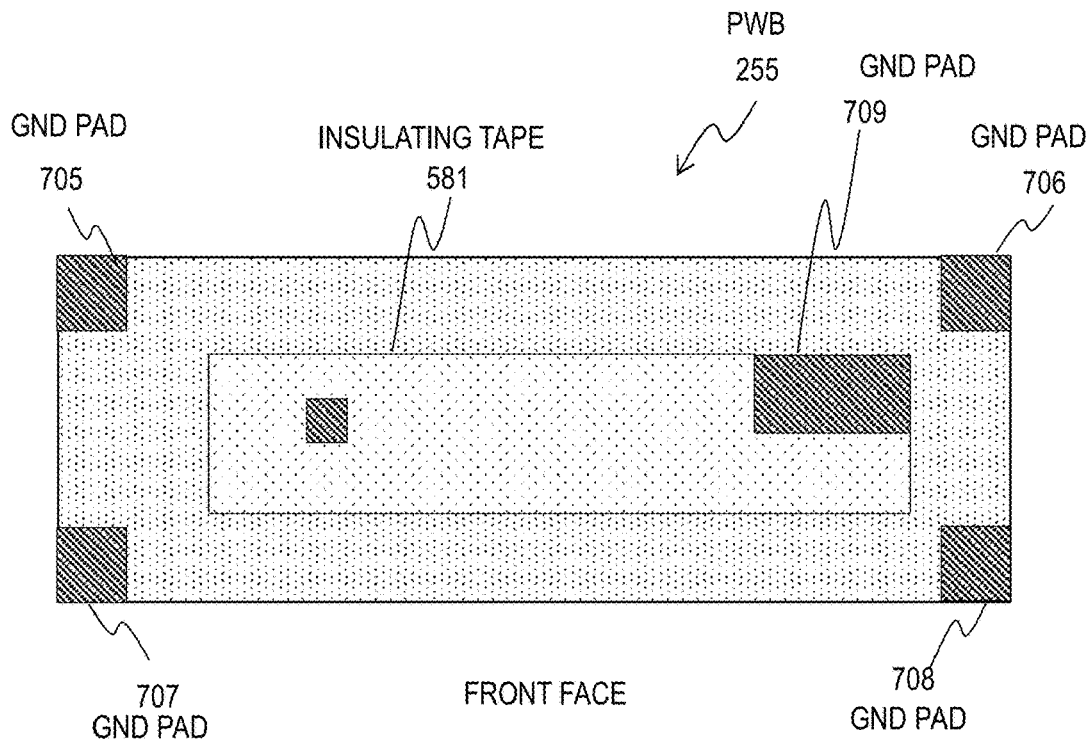
FIG. 12 illustrates another example of adjustment of the conductive regions of front ground pads.

FIG. 12 illustrates an example of adjustment of the conductive regions of front ground pads. The PWB 255 includes front ground pads 705 to 708 at four corners and in addition, a front ground pad 709 at the center. The ground pad 709 is partially covered with an insulating tape 581 and some regions are exposed from the insulating tape 581. Each of these exposed regions corresponds to the region of a circuit that is mounted on the back face of the PWB 255 and becomes a noise source. Examples of the circuits to become a noise source include the MPU 251 and the power supply circuit 253.

Figure 13:
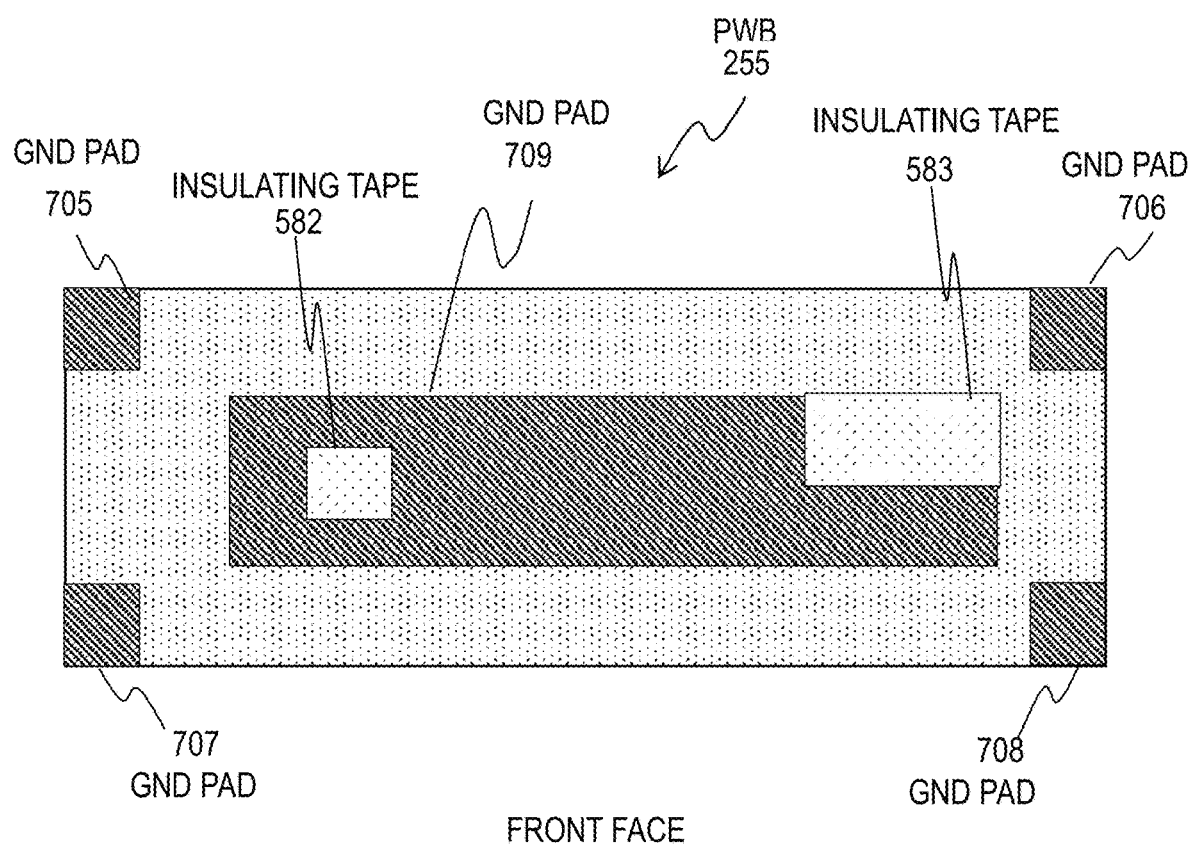
FIG. 13 illustrates still another example of adjustment of the conductive regions of front ground pads.

FIG. 13 illustrates still another example of adjustment of the conductive regions of front ground pads. The PWB 255 includes front ground pads 705 to 708 at four corners and in addition, a front ground pad 709 at the center. Some regions of the ground pad 709 are covered with insulating tapes 582 and 583 and the other region of the ground pad 709 is exposed from the insulating tapes 582 and 583. Each of the regions covered with the insulating tapes 582 and 583 corresponds to the region of a circuit that is mounted on the back face of the PWB 255 and becomes a noise source. Embodiments of this disclosure improve the electromagnetic compatibility (EMC) of a display device. Display devices are demanded to satisfy EMC requirements that are different depending on their application fields. Especially for on-vehicle display devices, specific EMC requirements severer than the international standard tend to be regulated.

For example, the liquid crystal display device described above with reference to the drawings includes an in-cell type of touch panel and uses a TDDI, which is a driver IC 134 in which a touch panel controller and a timing controller are integrated. This configuration has factors that worsen the EMC as described as follows.

In general, the EMI of a digital circuit has the following causes: (1) spike current that flows in a signal line when a digital signal transmitted through the signal line changes between Low and High, (2) through current that flows within the IC circuit when the IC circuit outputs a digital signal, (3) insufficient functioning of a decoupling capacitor in the IC circuit, and (4) common mode noise caused by vulnerability of the signal ground (GND) of the device including the IC circuit.

Some TDDIs use serial signal communication such as serial peripheral interface (SPI) between the TDDI and the processor (MPU). The standard operating condition of the SPI is from 2.0 V to 3.6 V, which is the same as the operating condition of a CMOS; the signal amplitude in the SPI is larger than the amplitude of an eDP signal or an LVDS signal used to transmit a video signal. Accordingly, when the signal varies, the variation of current with respect to time is large. For this reason, when the TDDI communicates via SPI, very high noise current is generated between the TDDI and the processor.

Meanwhile, the TDDI is mounted on a display panel that cannot provide a sufficiently large area for the signal GND line because of a slim bezel and therefore, the signal GND tends to be vulnerable, worsening the EMI.

An in-cell type of touch panel needs to sense variation in capacitance with touch electrodes within a liquid crystal cell. To sense the variation in capacitance with high accuracy, the LCD panel 10 needs to be provided with high resistance on its surface when conductivity is provided. For this reason, an antistatic layer does not work as an electromagnetic shield layer like the one in an out-cell type of touch panel.

When the signal GND and the electromagnetic shield of a digital circuit are vulnerable as described above, the circuit is easily affected by external electromagnetic noise. The external noise propagates to the signal GND without being blocked to interfere with the control signals used in the device; the noise immunity (EMS) of the device worsens.

The features of the embodiments of this disclosure provide great effects especially on display devices including an in-cell type of touch panel and display devices with a TDDI, which tend to have poor EMC. However, they also provide EMC improving effects on display devices having configurations other than these, such as display devices without a touch sensing function. Hereinafter, EMC improvement by the configurations of the embodiments of this disclosure is described.

First, EMC improvement by the front ground pads is described. In the above-described embodiments, the front ground pads 501 and 502 are electrically connected to the metal chassis 450 that provides the frame ground in the regions closer to the FPC 135 or the driver IC 134. As a result, the signal ground of the FPC 135 and the driver IC 134 is stabilized and therefore, the noise energy is reduced.

In an embodiment of this disclosure, there is no front ground pad electrically connected to the metal chassis 450 on the opposite side of the side where the FPC 135 is connected. This configuration does not have a long return path to transmit the noise current from the external and therefore, the noise energy is reduced.

In an embodiment of this disclosure, insulating tapes increase the resistance of the ground pads 501 and 502 electrically connected to the metal chassis 450. As a result, the noise received by the metal chassis 450 becomes difficult to propagate to the PCB 250, reducing the possibility of malfunction of the circuit.

Electrically connecting the front ground pads 501 and 502 near the FPC 135 to the metal chassis 450 attains a short propagation path of surge noise. Hence, malfunction of the circuit is reduced.

Next, EMC improvement by the conductive shield cover 520 is described. In an embodiment of this disclosure, the conductive shield cover 520 covers at least a part of the PCB 250 and is electrically connected to the backside ground pads and also, it is electrically connected to the metal chassis 450. This configuration reduces the effect of the external noise onto the circuit. Furthermore, this configuration releases the surge noise to the metal chassis 450. The configuration such that the conductive shield cover 520 further covers a part of the FPC 135 reduces the effects of the external noise onto the FPC 135.

In an embodiment of this disclosure, the conductive shield cover 520 is disposed to cover the back face 532 of the PWB 255. This configuration reduces the direct effect of the external noise onto the PWB 255. Furthermore, the conductive shield cover 520 is electrically connected to the metal chassis 450 only on the opposite side of the FPC 135. This configuration improves the ground resistance or the ground loop, narrowing the path for the external noise to come from the metal chassis 450. For example, the resistance between the metal chassis 450 and the conductive shield cover 520 increases to improve the immunity. Furthermore, the path for the noise to come from the metal chassis 450 is distant from the FPC 135 and therefore, the noise significantly attenuates before reaching the FPC 135.

As set forth above, embodiments of this disclosure have been described; however, this disclosure is not limited to the foregoing embodiments. Those skilled in the art can easily modify, add, or convert each element in the foregoing embodiments within the scope of this disclosure. A part of the configuration of one embodiment can be replaced with a configuration of another embodiment or a configuration of an embodiment can be incorporated into a configuration of another embodiment.

What is claimed is:

1. A display device comprising:
   a display panel configured to display an image toward the front of the display panel;
   a driver circuit on the display panel;
   a conductive frame that is disposed behind the display panel and supplies a frame ground;
   a control printed board disposed behind the conductive frame;
   a flexible printed board connecting the display panel and the control printed board to transmit signals and a ground between the driver circuit and the control printed board; and
   a conductive shield cover covering at least a part of the back face of the control printed board,
   wherein the control printed board includes a front ground pad on the front face of the control printed board and a backside ground pad on the back face of the control printed board,
   wherein the front ground pad is electrically connected to the back face of the conductive frame in a region opposed to each other,
   wherein the backside ground pad is electrically connected to the conductive shield cover in a region opposed to each other, and
   wherein a part of an end of the conductive shield cover covers a partial region of the back face of the conductive frame and is electrically connected to the partial region.

2. The display device according to claim 1, wherein the front ground pad is disposed on a side where the flexible printed board is connected to the control printed board.

3. The display device according to claim 2, wherein the control printed board does not have a front ground pad electrically connected to the back face of the conductive frame on the opposite side of the side where the flexible printed board is connected.

4. The display device according to claim 3, wherein the conductive shield cover is electrically connected to the back face of the conductive frame only on the opposite side of the side where the flexible printed board is connected to the control printed board.

5. The display device according to claim 1,
   wherein the flexible printed board is connected to the control printed board in a first side region of the control printed board,
   wherein one or more front ground pads including the front ground pad are disposed in the first side region, and
   wherein, in the front face of the control printed board, only the one or more front ground pads are electrically connected to the back face of the conductive frame in regions opposed to each other.

6. The display device according to claim 1, wherein the conductive shield cover is electrically connected to the back face of the conductive frame only on the opposite side of the side where the flexible printed board is connected to the control printed board.

7. The display device according to claim 1,
   wherein the front ground pad is electrically connected to the back face of the conductive frame via a conductive adhesive in a region opposed to each other, and
   wherein the conductive adhesive is applied to a smaller area than the front ground pad.

8. The display device according to claim 1,
   wherein the control printed board includes a plurality of backside ground pads, and
   wherein each of the plurality of backside ground pads is electrically connected to the conductive shield cover in a region opposed to each other.

9. The display device according to claim 1, wherein resistance between the backside ground pad and the conductive shield cover is higher than resistance between the front ground pad and the conductive frame.

10. The display device according to claim 9, wherein resistance between the conductive shield cover and the conductive frame is higher than resistance between the backside ground pad and the conductive shield cover.

11. The display device according to claim 1, wherein the control printed board is a rigid printed board.

12. The display device according to claim 1,
    wherein the display panel includes touch sensor electrodes,
    wherein the driver circuit includes an image display controller and a touch sensing controller, and
    wherein the flexible printed board transmits a serial signal between the driver circuit and a circuit on the control printed board.

* * * * *